(12) United States Patent
Charlier et al.

(10) Patent No.: US 6,581,747 B1
(45) Date of Patent: Jun. 24, 2003

(54) TOKEN WITH AN ELECTRONIC CHIP AND METHODS FOR MANUFACTURING THE SAME

(75) Inventors: Gérard Charlier, Paris (FR); Eric Luc Philippe, Salon de Provence (FR)

(73) Assignee: Etablissements Bourgogne et Grasset, Savigny-les-Beaune (FR)

( * ) Notice: Subject to any disclaimer, the term of this patent is extended or adjusted under 35 U.S.C. 154(b) by 0 days.

(21) Appl. No.: 09/545,889

(22) Filed: Apr. 7, 2000

(30) Foreign Application Priority Data

Feb. 15, 2000 (FR) .............................. 00 01812

(51) Int. Cl.[7] ................................ G07F 1/06

(52) U.S. Cl. ................... 194/214; 186/37; 235/380

(58) Field of Search ................... 194/214, 302, 194/317; 186/37; 235/380; 273/297, 293

(56) References Cited

U.S. PATENT DOCUMENTS

| | | |
|---|---|---|
| 1,935,308 A | 11/1933 | Baltzley |
| 2,410,845 A | 11/1946 | Snell et al. |
| 2,450,997 A | 10/1948 | Shann |
| 2,836,911 A | 6/1958 | Priesmeyer |
| 2,983,354 A | 5/1961 | Ember et al. |
| 3,295,651 A | 1/1967 | Klackowski et al. |
| 3,439,439 A | 4/1969 | Stimson |
| 3,670,524 A | 6/1972 | Korwin |
| 3,766,452 A | 10/1973 | Burpee et al. |
| 3,926,291 A | 12/1975 | Burke et al. |

(List continued on next page.)

FOREIGN PATENT DOCUMENTS

| | | | |
|---|---|---|---|
| AU | 6854690 | 7/1991 | ......... A44C/021/00 |
| DE | 89097831 | 10/1990 | ......... G06K/19/00 |
| DE | 93001738 | 4/1993 | ......... A22C/15/00 |
| DE | 4311561 | 10/1994 | |
| DE | 295059516 | 7/1995 | ............. G07F/3/00 |
| DE | 19504194 | 4/1996 | |
| DE | 19710656 | 9/1998 | |
| EP | 0123557 | 10/1984 | |
| EP | 0147099 | 7/1985 | |
| EP | 0295085 | 12/1988 | |
| EP | 0350179 | 1/1990 | .......... G06K/19/06 |
| EP | 0412545 | 2/1991 | |
| EP | 0424355 | 4/1991 | |
| EP | 0436497 | 7/1991 | ............. G07D/5/08 |
| EP | 0444373 | 9/1991 | |
| EP | 0459722 | 12/1991 | |
| EP | 0564051 | 10/1993 | .......... G06K/19/02 |
| EP | 0570062 | 11/1993 | |
| EP | 0570784 | 11/1993 | |

(List continued on next page.)

OTHER PUBLICATIONS

SAECHTLING: "Plastic Handbook"1983, HANSER, München XP002168357.
English Language Abstract of DE 19710656.
English Language Abstract for EPO 587 011.

*Primary Examiner*—Donald P. Walsh
*Assistant Examiner*—Mark J Beauchaine
(74) *Attorney, Agent, or Firm*—Greenblum & Bernstein, P.L.C.

(57) ABSTRACT

A device and method making the device. The device includes a flat body made of a plastic material. The flat body has at least two parallel faces and a cavity which opens to at least one of the at least two parallel faces. The cavity is adapted to receive an electronic identification device. At least one plug made of a plastic material is included. The at least one plug is adapted to be inserted into the cavity. The electronic identification is retained in the flat body when the at least one plug is inserted into the cavity. The method includes making the flat body, forming the cavity in the flat body, placing the electronic identification device in the cavity, inserting the at least one plug in the cavity, and fixing the at least one plug to the flat body.

31 Claims, 2 Drawing Sheets

U.S. PATENT DOCUMENTS

| | | | |
|---|---|---|---|
| 3,953,932 A | * 5/1976 | Graves | 40/27.5 |
| 3,968,582 A | 7/1976 | Jones | 40/27.5 |
| 3,983,646 A | 10/1976 | Howard | |
| 4,026,309 A | 5/1977 | Howard | |
| 4,260,881 A | 4/1981 | Peterson | |
| 4,261,947 A | 4/1981 | Ogi | |
| 4,371,071 A | 2/1983 | Abedor et al. | |
| 4,395,043 A | 7/1983 | Gargione | |
| 4,399,910 A | 8/1983 | Gutentag | |
| 4,435,911 A | * 3/1984 | Jones | 40/27.5 |
| 4,511,796 A | 4/1985 | Aigo | |
| 4,637,613 A | 1/1987 | Bishop | |
| 4,674,618 A | 6/1987 | Eglise et al. | |
| 4,675,973 A | 6/1987 | Siu | |
| 4,725,924 A | 2/1988 | Juan | |
| 4,792,843 A | * 12/1988 | Haghiri-Tehrani et al. | 235/488 |
| 4,814,589 A | 3/1989 | Storch et al. | |
| 4,818,855 A | 4/1989 | Mongeon et al. | |
| 4,827,640 A | 5/1989 | Jones | 40/27.5 |
| 4,838,404 A | 6/1989 | Smith et al. | |
| 4,848,855 A | 7/1989 | Cone | |
| 4,926,996 A | 5/1990 | Eglise et al. | |
| 4,969,549 A | * 11/1990 | Eglise | 194/205 |
| 4,973,524 A | 11/1990 | Huebner et al. | |
| 4,983,820 A | 1/1991 | Dias | |
| 4,999,742 A | * 3/1991 | Stampfli | 361/782 |
| 5,038,022 A | 8/1991 | Lucero | |
| 5,094,922 A | * 3/1992 | Ielpo et al. | 40/27.5 |
| 5,103,081 A | 4/1992 | Fisher et al. | |
| 5,166,502 A | 11/1992 | Rendleman et al. | |
| 5,216,234 A | 6/1993 | Bell | |
| 5,283,422 A | 2/1994 | Storch et al. | |
| 5,361,885 A | 11/1994 | Modler | |
| 5,399,847 A | 3/1995 | Droz | |
| 5,406,264 A | 4/1995 | Plonsky et al. | |
| 5,451,756 A | 9/1995 | Holzer et al. | |
| 5,498,859 A | 3/1996 | Farmont | |
| 5,585,618 A | 12/1996 | Droz | |
| 5,619,066 A | 4/1997 | Curry et al. | |
| 5,676,376 A | 10/1997 | Valley | |
| 5,690,773 A | 11/1997 | Fidalgo et al. | 156/267 |
| 5,706,925 A | * 1/1998 | Orus et al. | 194/214 |
| 5,735,742 A | 4/1998 | French | |
| 5,794,532 A | 8/1998 | Gassies et al. | 101/493 |
| 5,895,321 A | 4/1999 | Gassies et al. | 463/29 |
| 5,988,510 A | 11/1999 | Tuttle et al. | |
| 6,021,949 A | 2/2000 | Boiron | |
| 6,036,099 A | * 3/2000 | Leighton | 156/154 |
| 6,176,185 B1 | * 1/2001 | Charlier et al. | 101/170 |
| 6,206,291 B1 | 3/2001 | Droz | |
| 6,264,109 B1 | * 7/2001 | Chapet et al. | 235/487 |
| 6,352,261 B1 | * 3/2002 | Brown | 273/288 |
| 6,390,375 B2 | * 5/2002 | Kayanakis | 235/380 |
| 2001/0015382 A1 | * 8/2001 | Tiffany, III | 235/488 |

FOREIGN PATENT DOCUMENTS

| | | | |
|---|---|---|---|
| EP | 0587011 | 3/1994 | |
| EP | 587011 | 3/1994 | G06K/7/08 |
| EP | 0646893 | 4/1995 | G06K/19/077 |
| EP | 0650148 | 4/1995 | |
| EP | 0669597 | 8/1995 | G06K/19/077 |
| EP | 0694872 | 1/1996 | G06K/19/077 |
| FR | 1001412 | 2/1952 | |
| FR | 2520541 | 7/1983 | G11B/5/80 |
| FR | 2554293 | 5/1985 | |
| FR | 2579799 | 10/1986 | G06K/19/06 |
| FR | 2644268 | 9/1990 | |
| FR | 2656538 | 7/1991 | |
| FR | 2663145 | 12/1991 | |
| FR | 2721733 | 12/1995 | |
| FR | 2727542 | 5/1996 | |
| FR | 2739587 | 4/1997 | |
| FR | 2769110 | 4/1999 | G06K/19/077 |
| GB | 1599120 | 9/1981 | |
| GB | 2075732 | 11/1981 | |
| GB | 2077556 | 12/1981 | |
| GB | 2153128 | 8/1985 | |
| GB | 2180086 | 3/1987 | |
| WO | 88/01082 | 2/1988 | |
| WO | 92/07343 | 4/1992 | |
| WO | 92/21105 | 11/1992 | |
| WO | 95/08164 | 3/1995 | |
| WO | 96/14115 | 5/1996 | |
| WO | 98/13998 | 4/1998 | H04M/11/06 |

* cited by examiner

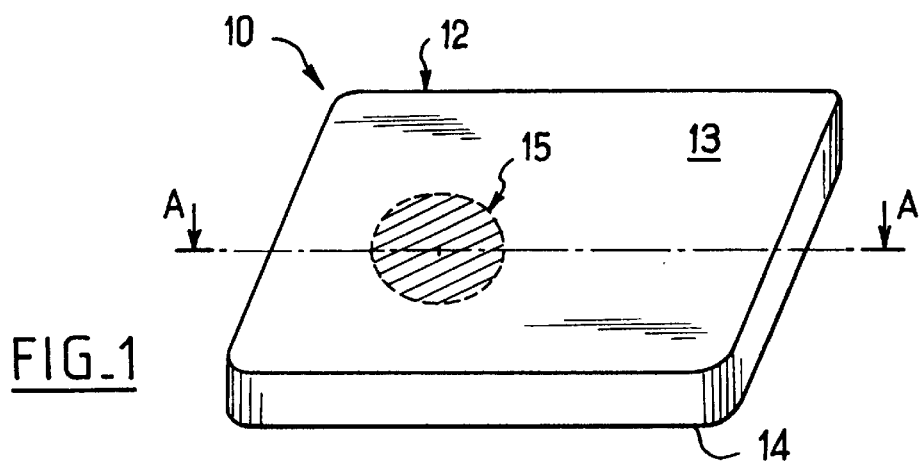
FIG_1
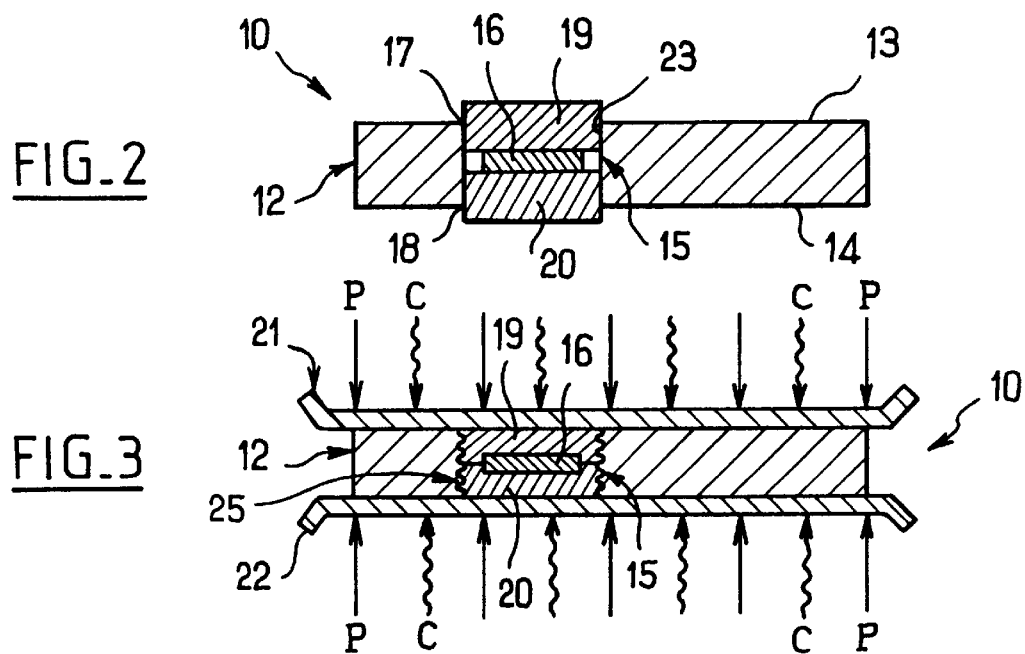
FIG_2
FIG_3
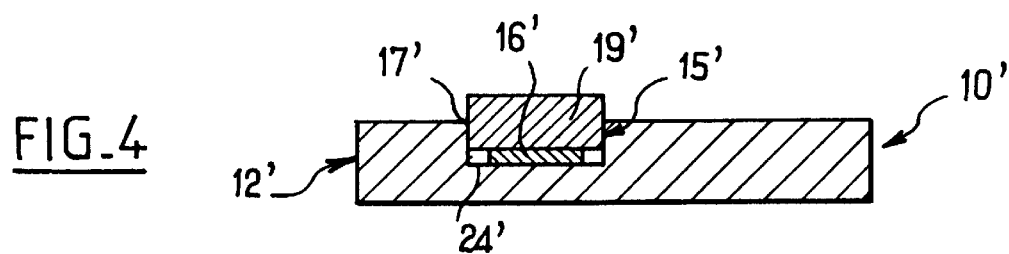
FIG_4
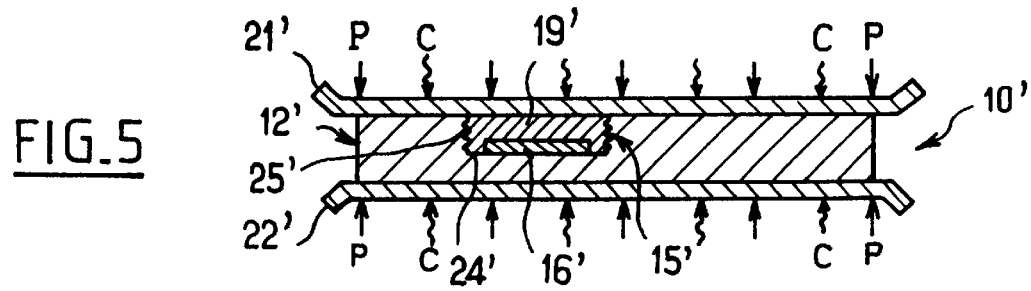
FIG_5

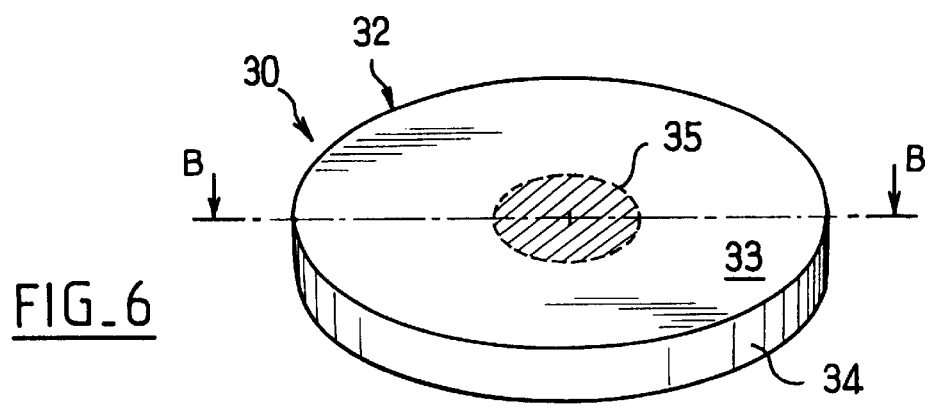
FIG._6
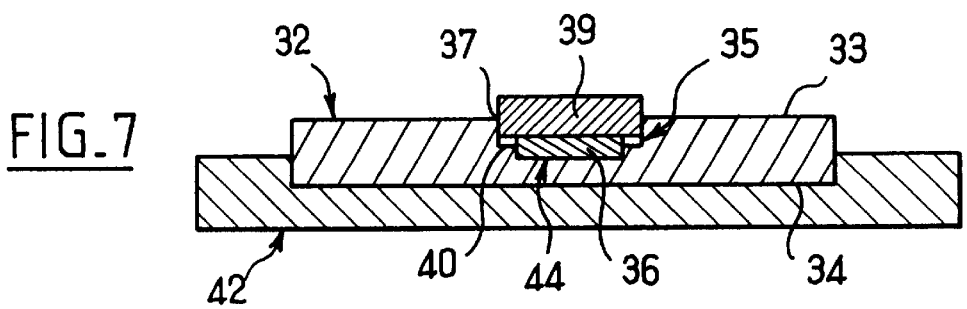
FIG._7
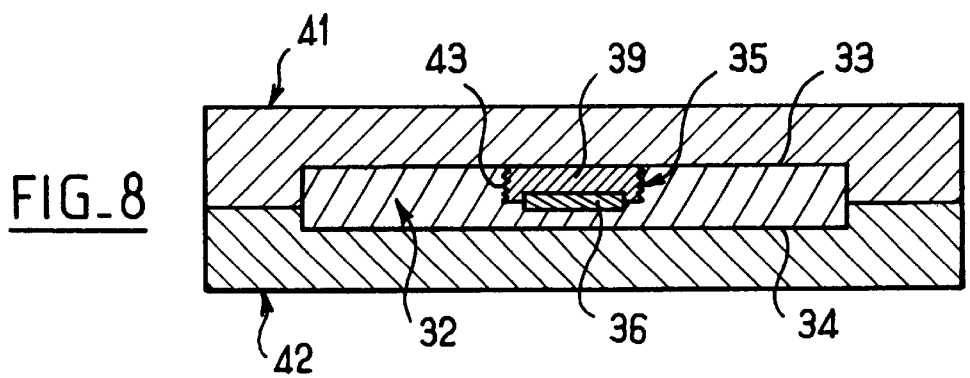
FIG._8
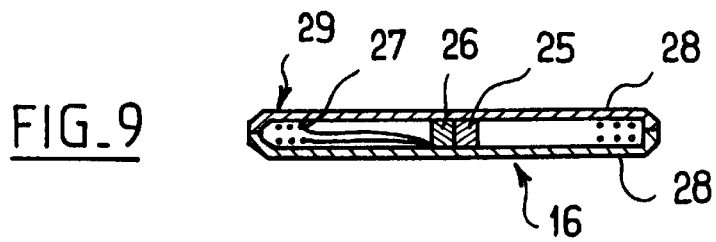
FIG._9
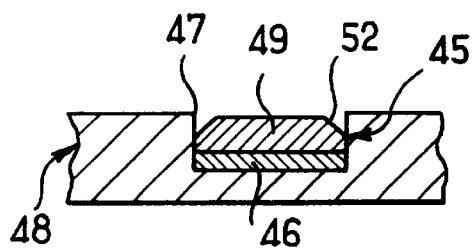
FIG._10a
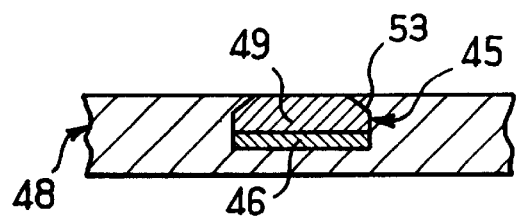
FIG._10b

TOKEN WITH AN ELECTRONIC CHIP AND METHODS FOR MANUFACTURING THE SAME

BACKGROUND OF THE INVENTION

1. Field of the Invention

This invention generally concerns gaming tokens such as disks or flat plaques integrating an electronic chip or an electronic identifier (indifferently called hereafter electronic identification device). The applications for this invention are to be found, amongst others, in the contactless identification of persons and objects also called electronic labelling and in the authentication, the identification and management (in particular the tracing and counting) of gaming tokens also called casino chips. The expression "gaming token" covers any token that can be used in a gaming room and representing a value that is predetermined or not. Gaming token are usually made of a rigid plastic material to obtain a structure that is solid enough to resist conditions of use in casinos which are often very tough.

2. Description of Background and Relevant Information

The patent application EP-A-0694872 in the name of the Applicant describes a gaming token or plaque the body of which integrating an electronic chip is made from laminated sheets of rolled plastic material. The electronic chip or electronic identifier includes an electronic circuit with a memory bearing identification and/or coding information concerning the person or object associated with the token (electronic label) or the token itself (gaming token or payment token), the electronic circuit generally being associated with an emitter-receiver connected to an antenna and adapted to be supplied by inductive coupling. The electronic chip is placed in the centre of an opening provided in the body of the plaque, protected and held on either side by two rigid pellets and finally made one and integrated into the body of the plaque by a lamination of top sheets of transparent cellulose acetate followed by the thermoforming of the whole.

The manufacturing process for the body of the plaque incorporating the electronic chip by laminating thin sheets of plastic material described in the above mentioned patent application is well adapted to highly decorated plaques and representing a high nominal value, usually manufactured in small or medium sized series. However, a good protection of the electronic chip when it is integrated into the body of the plaque requires a certain thickness (usually between 4 and 6 mm) so gaming tokens or plaques with a thickness of about 3 mm and equipped with an electronic chip are difficult to manufacture using this method with an excessive number of rejects resulting from the destruction of the chip.

Among the less expensive manufacturing methods for gaming plaques and tokens, the thermocompression method of a plastic compound in a mould giving the final shape of the token is known from the U.S. Pat. No. 3,968,582. As a variant, peripheral inserts of various colours are obtained by the partial elimination of the plastic compound around the token preform and replacement by inserts of a coloured material before the thermocompression operation. The tokens thus obtained, however, offer a poor visual quality decoration and do not include any electronic identifier.

SUMMARY OF THE INVENTION

One object of the invention is to propose a new manufacturing method for tokens with an electronic identifier, simple in structure, compact and robust, particularly for namely thin tokens, allowing easy and inexpensive manufacture suitable for mass production.

For this purpose, the invention proposes a gaming token or plaque or similar device, including a flat body with approximately parallel surfaces, made of plastic with a cavity in which an electronic identification device is placed, characterised in that the cavity offers at least one face opening closed by a plastic plug inserted into the cavity and made one directly with the flat body.

The structure of the gaming token or plaque according to the invention and in which the plastic plug is inserted into the cavity and made one directly with the plastic of the token makes the token very robust while reducing its thickness (by eliminating any superfluous layer of plastic). Furthermore, the simplification of their structure makes the tokens in accordance with the invention much more easy to manufacture. Preferably, in variants of the realisation of the invention plugs are used inserted with a minimum clearance in the face openings of the cavities having matching shapes and directly made one with the body of the token or plaque by gluing, welding (fusion/welding or ultrasonic welding) and/or mechanical interlocking, for example by deformation by heating and/or compression of the token body at and around the area of the surface opening of the cavity and fold down plastic material around the plug, preferably previously bevelled.

According to a one, embodiment of the invention, the plug, inserted into the cavity in a solid state, possibly softened or pasty, is deformed and welded to the body of the token by combined heating and pressure. As it is described in the rest of the disclosure, the heating of the body and/or token may take place before the pressure is applied and/or simultaneously with the application of the pressure depending on the plastics used, on the shapes of the items to be welded and the heating and press devices used.

Thus, the deformation capacity of the plug reduces the risks of deterioration of the electronic identifier while ensuring a very robust weld, most often with interlocking, at the level of the side wall of the cavity and a good cohesion between the token body thus completed and the electronic identifier. Preferably, the combined application of heating and pressure extends over the plug and over the two entire faces of the body, which generally allows a good surface aspect to be obtained at once on both faces of the token or plaque.

According to a first variant, the body has a through cavity closed by two plugs placed on either sides of the electronic identification device. This arrangement allows a better distribution of the stresses on the electronic identification device when the welding operation by combined heat and pressure is carried out.

According to another variant, the body offers a non-through cavity with a flat or stepped bottom intended to receive all or part of the electronic identification device and closed by a plug.

Preferably, the electronic identification device includes an electronic circuit having a memory containing information concerning the token, for example an identification code and an emitter-receiver with a peripheral antenna adapted to be supplied by inductive coupling, the whole being placed in a protective enclosure such as a thin film flat envelope, a protective shell made of rigid plastic or a hardened coating resin pellet, especially of the epoxy type. Preferably, the electronic identification device and the protective enclosure are in the form of a flat disk with a smaller diameter than the diameter of the cavity so that it can be fitted at least partly into the housing formed by the stepped bottom of the cavity.

According to another embodiment of the invention, the body and or the plug are each made of an identical or different thermoplastic material, loaded or not, and showing a vitreous transition temperature of between 40° C. and 130° C., preferably between 50° C. and 100° C.

As various variants of embodiments of the invention using bodies and plugs of thermoplastic material in general, the bodies and plugs are each made of a thermoplastic material, loaded or not, and belonging to one of the following families:

the styrenes and their copolymers, in particular PBS and ABS, the methacrylics, in particular PMMA, the vinyls in particular PVC and their copolymers, the celluloses, in particular cellulose acetate, the saturated polyesters, in particular PBT and the polyolefins, in particular PE hd and their copolymers.

According to yet another embodiment of the invention, the body and the plug are made of identical or different thermosetting plastic, loaded or not, namely a material belonging to the family of non-saturated polyesters.

Preferably, but as an option, the body and the plug for the last two embodiments of the invention presented above are made of plastic materials having the same basic polymer, so as to facilitate in particular the welding between the body and the plug, or of plastic material compatible with the welding.

The invention also concerns a method of manufacturing a gaming token or plaque or similar device, hereinafter indifferently called token, with a thermoplastic body, including the following operations:

manufacturing by groups or by unit, of the thermoplastic token body, making of a cavity in the body having at least one face opening, making in the cavity of the electronic identification device and insertion of a plug, in each face opening, closing of the cavity by welding of the plug(s) with the token body previously heated, in particular and around the area of each opening by applying pressure to the heated area(s), as an option, cutting of the contour of the token body and/or finishing of the edge of the token if necessary.

The invention also concerns a method of manufacturing a gaming token or plaque or similar device, hereinafter indifferently called token, with a thermosetting body, characterised in that it includes the following operations:

manufacturing of a preform of the token body in a thermosetting plastic material, making of a cavity in the preform having at least one face opening, placing of the electronic identification device in the cavity and insertion of a plug, in each face opening, placing in a mould of the whole composed of the preform of the token body equipped with the electronic identification device and plug(s), making of the token body by thermocompression of the whole and closing of the cavity in the token body.

It should also be noted that the invention is not limited to gaming tokens and plaques, but also concerns similar devices equipped with an electronic chip and having similar shapes and structures, in particular fixed amount prepaid tokens and electronic payment tokens, electronic labels, plaques or electronic identification cards and it should also be noted that electronic identification may sometimes be limited to a simple authentication of the electronic chip, i.e. the recognition of the presence of the chip by the associated contactless reader (radio-frequency reader also called RFID reader) for electronic transaction (read and/or write).

Other objects, characteristics and advantages of the present invention will appear on reading the following description of various embodiments of the invention including methods of manufacturing therefor and given as non restricting examples in reference to the attached drawings.

BRIEF DESCRIPTION OF THE DRAWINGS

FIG. 1 shows a perspective view of a gaming plaque made of thermoplastic material with a through cavity in accordance with a first embodiment of the invention;

FIG. 2 shows a longitudinal sectional view in a plane perpendicular to the plaque and passing through the line AA, of the plaque body of FIG. 1 equipped with the electronic identifier before fixation of the plugs;

FIG. 3 shows a longitudinal sectional view in a plane perpendicular to the plaque and passing through the line AA, of the plaque of FIG. 1 after fixation of the plugs;

FIG. 4 shows a longitudinal sectional view similar to FIG. 2 concerning a variant of the plaque of FIG. 1 with a non through cavity before fixation of the plug;

FIG. 5 shows a longitudinal sectional view similar to FIG. 3 concerning the variant of the plaque of FIG. 1 with a non through cavity shown in FIG. 4 after fixation of the plug;

FIG. 6 shows a perspective view of a gaming token made of thermosetting material with a non-through cavity in accordance with a second embodiment of the invention;

FIG. 7 shows a diametral sectional view, in a plane perpendicular to the token and passing through line BB, of the preform of the body of the token in FIG. 6, equipped with the electronic identifier and the plug before the thermocompression operation;

FIG. 8 shows a diametral sectional view, in a plane perpendicular to the token and passing through line BB of the token of FIG. 6, after the thermocompression operation;

FIG. 9 shows a diametral sectional view of the electronic identification device integrated into the plaques and tokens in accordance with the invention; and FIGS. 10a and 10b illustrate the technique used to interlock the plug into the token body and each shows a sectional view respectively before and after compression on the token body.

It should be noted that the plaques and tokens illustrated in the drawings presented above are shown to a scale that is larger in thickness to facilitate the understanding of the drawings.

DETAILED DESCRIPTION OF THE INVENTION

FIGS. 1 to 3 concern a first embodiment the token or plaque in accordance with the invention with a deformable plug and according to which the body of the token or plaque is composed of a thermoplastic material, in the present case a gaming plaque 10 approximately rectangular shown in perspective, the flat body 12 of which shows two approximately parallel faces 13 and 14. The plaque integrates a chip or electronic identifier 16 placed in a cavity 15 crossing through the body 12 perpendicular to the faces 13 and 14 as seen in FIG. 2 (and represented in FIG. 1 by dashes). Of course the description of this embodiment of the invention also applies to disk shaped token with a circular contour and to flat tokens or plaques with various contours, namely elliptic.

Generally, the electronic identification device 16 (shown as a cross-section in FIG. 9) includes an electronic circuit 25 with a PROM memory containing information on the token and or the person or object associated with the token, for example a fixed digital or alphanumerical identification code of 64 bytes (including one or several fields such as: the serial number, the identification of a product, batch or place, a digital value associated with the token, etc.), and an emitter-receiver 26 with a peripheral circular antenna 27 adapted to be fed by inductive coupling from the modulated waves of the reader station (not shown). Practically, the emitter-receiver is capable of exchanging data without contact by modulated waves with a remote reader station (for example, between 15 cm and 2 m), the working frequency lying being 10 kHz and 20 MHz. The electronic device containing a memory for example can be used as a protection against theft and/or to facilitate the management and inventory of a batch of objects in a defined space (storage areas, warehouses, stores). Of course, without going beyond the scope of the invention, the electronic device 16 equipped with a memory of a non-reprogrammable type (read-only) can be replaced by a changing code reprogrammable device with possibility of reading and writing to the memory.

The electronic identification device 16 including the emitter-receiver 26 and the peripheral antenna 27 is placed between two thin and resistant plastic films 28 welded on the periphery to form a protective envelope, the whole being in the form of a thin pellet 29 of a maximum thickness of around one millimetre and a diameter of between 10 and 20 mm. As a result, the cavity 15 has a cylindrical shape with a circular base of a diameter slightly greater by a few millimetres (see FIG. 2) thus avoiding a premature deterioration of the electronic chip when the electronic identifier is placed in the cavity. Furthermore, without going beyond the scope of the invention, cavities with various sections (namely rectangular) are used to house the electronic identifiers the antennas of which have matching contours (namely rectangular).

It should be noted that the invention is not limited to this type of thin film protection of the electronic identifier, but also concerns the integration of any electronic identifier in its protective enclosure, namely identifiers enclosed in a rigid plastic shell, for example a shell made of injected plastic for an electronic label such as described in the patent application WO-A-98/39989 in the name of the Applicant, or embedded in a hardened resin in particular of the epoxy type. Practically, the choice of the protective enclosure depends on the level of protection required for the electronic chip itself and necessary to allow the chip to resist the rise in temperature and pressure when the cavity is closed and the plug welded.

The body 12 of the plaque can be realised indifferently either by the unit, for example by injection moulding, the cavity, whether crossing through the body or not, being obtained directly during moulding, or in group from thick sheets or strips (monobloc or welded, glued or laminated multiple layers) of predimensioned thermoplastic material either having the final thickness of the plaque or token, for example 3 mm (in the event of limited surface compression) or a slightly greater thickness, for example 4 mm for 3 mm (in the event of compression over the whole face of the plaque or token such as illustrated in FIGS. 3 and 5), the other dimensions possibly reaching one meter.

According to a first variant with a through cavity illustrated in FIG. 2 the thick sheet or strip is pierced with the number of holes corresponding to the number of plaques or tokens to be produced, the degrouping of the plaques or tokens obtained by cutting and punching or by milling the contour of the plaque or token, cut also called trimming, being carried out at the end of manufacture after integration of the electronic identifier 16 and closing of the cavity.

According to another variant, the thick sheet or strip is softened by heating (between 50° C. and 150° C.) and punched to obtain individually the body 12, 12' of the token or plaque. Simultaneously, the cavity intended to be used as housing recess for the electronic identifier is realised:
- either as a through hole 15 by punching or cutting out,
- or as a blind hole, non-through cavity 15' with a flat bottom 24' or a stepped bottom, either by die stamping on a part that is still hot or by non-opening spot facing with a milling cutter on a harder cooled part. For example, the cavity has a depth of approximately 2 mm.

The plugs 19, 20, 19' are obtained for example by punching (cold or hot if necessary) from plates or strips with a thickness of between 1 and 1.5 mm.

As shown in FIG. 2, the through cavity 15 has two face openings 17 and 18. The integration of the electronic identifier 16 starts by placing it between the two plugs 19 and 20.

The plugs 19 and 20 are inserted (with the electronic identifier 16') in the cavity 15 preferably with a minimum clearance in solid state, sometimes softened or pasty, deformable during the later stage of compression or welding. The plugs 19 and 20 have a contour that matched that of the cavity 15, e.g. a circular contour, and have a thickness that makes their two external faces slightly overlap that of the faces 13 and 14 of the body 12 so as to ensure the complete filling of the cavity 15 and a solid weld with mechanical interlocking more or less undulated 25 (see FIG. 3), in the side wall 23 of the cavity when the face openings 17 and 18 are closed.

As a non restricting example, the body 12 and the plugs 19 and 20 are made of the same thermoplastic material, in this case loaded between 50% and 70% with barite or barium sulphate, chosen from among one of the following polymer families:
- the styrenes and their copolymers, namely polybutadien-estyrene (PBS) and acrylonitrile-butadiene styrene (ABS),
- the methacrylics, namely polymethylmethacrylate (PMMA),
- the vinyls, namely polyvinyl chloride (PVC) and their copolymers,
- the celluloses, namely cellulose acetate,
- the saturated polyesters, namely polybutyleneterphtalate (PBT),
- and the polyolefines, namely high density polyethylene (PE hd) and their copolymers.

Still within the scope of the present invention, it should be noted that good weld joints can also be obtained by using for the body and plugs couples of different polymer based thermoplastic materials offering a good compatibility to be welded together, for example the couples ABS/PMMA, ABS/PBT and PVC/PBT. In any case, the undulated mechanical interlocking at joint level reinforces the weld.

The integration of the electronic identifier ends with the heating and compression (respectively shown in FIG. 3 by the straight arrows P and the curved arrows C) of the plugs 19 and 20 and the body 12 using a press, the hot plates 21 and 22 of which are arranged opposite each plug 19 and 20 on either side of the body of the plaque 12. These hot plates 21 and 22 which cover the whole surface of the faces 13 and 14 of the body of the plaque or token are mobile by bringing one close to the other by any known arrangement (not described) so as to push sufficiently, but not in excess, the plugs 19 and 20 towards the inside of the cavity 15 so as to embed the thin pellet or protective envelope 29 of the identifier 16 and to hold the latter in position. The controlled movement of the press with plates 21 and 22 enables the body of the plaque or token to be obtained directly at the required final thickness (for example 3 mm) the excess material being pushed to the edge of the token, the body in addition undergoing a slight optional reduction of its thickness (for example, approximately one millimetre).

In special situations, and in particular depending on then types of thermoplastic materials used for the bodies and plugs, the heating temperature is generally between 100° C. and 160° C. and the pressure applied generally between 1 and 10 Mpa (10 to 100 bars). Furthermore, it may be preferable to start heating the body and/or plug before applying the pressure on the plugs and/or body.

As shown in FIG. 3, the plugs 19 and 20, under the combined action of the heat and the pressure applied to each face 13 and 14, are deformed to become welded to the side wall 23 of the cavity 15 and most often form fitting and interlocking undulations 15 when the face openings 17 and 18 are closed, the limit of the welding area disappearing (at least on the surface), when using identical or almost identical thermoplastic material of the same colour for the plugs 19 and 20 and the body of the plaque 12. Thus, the creation of a real mechanical interlocking between the plug and the side of the cavity reinforces the weld joint. This interlocking is obtained more easily when heat and pressure are applied on the whole of the token face (the plastic flow being facilitated) rather than within an area limited to the plug and immediate surroundings of the face openings for the body.

In some cases, it is possible for the volume of the two plugs 19 and 20 to be slightly greater than the volume required to completely fill the cavity 15 once the identifier 16 has been installed, the excess material on the faces 13 and 14 after closing of the cavity 15 being caused to creep towards the edge of the body of the token or plaque.

The manufacture of the plaque (or token) continues with the cutting of the contour of the body in the event of group production from a thick sheet and/or the finishing of the edge, if necessary. As an option, it is possible to create a sunk decoration or a new hollow cavity (1 to 2 mm) by die punching and/or the placing of a surface decoration on the faces of the plaque (or token), for example by pad printing, hot punching or screen printed and heat bonded covering labels on the faces of the plaque (or token), etc.

FIGS. 4 and 5 concern a plaque 10' variant of the plaque 10 (or token) described above and distinguished from the latter by a non through cavity 15'. Of generally similar structure, plaques 10 and 10' have a large number of identical or similar technical characteristics, the description of which will not be repeated in detail below and which have the same numerical references accompanied by the sign'.

As shown in FIG. 4, the cavity 15' of the plaque 10' has a flat bottom 24' approximately parallel to the faces 13' and 14' and distant from the sole face opening 17' so as to place the electronic identifier 16' in median position in the thickness of the body 12' with its circular peripheral antenna in parallel position with the faces 13' and 14' of the plaque 10'. As with the plaque 10, a solid but deformable thermoplastic plug 19' is first of all inserted into the face opening 17' after placing the identifier 16' in the cavity 15' then welded with undulated mechanical interlocking 25' to the side wall 23' of the cavity 15' by heating and compression. Here again, the plug 19' slightly extends beyond the face 13' and has a sufficient volume to fill the cavity, extending around the periphery of the electronic identifier. It should be noted that it may be practical to heat the bottom 24' of the cavity 15' through the bottom heating plate 22' to ensure a good support between the electronic identifier 16' and the wall of the bottom 24'. In some cases, a spot of glue can be placed between the bottom 24' and the identifier 16'.

The invention is not limited to the ways, of heating and compression or thermocompression described herein, but concerns the use of technically equivalent ways known to specialists. In particular, the expression "heating" is used in a wide sense and covers more especially heating by electrical resistances, high frequency, micro-wave or infrared heating. Within the scope of the invention it is also possible to physically separate the ways of heating from the ways of compression (plate press). Finally, in certain variants of the realisation of the invention, the plug(s) are preheated before being inserted into the cavity. It is also possible to preheat or to heat during final compression the whole body of the token or plaque. In the same way, the pressing ways can be limited in surface for the thermoplastic material or cover the whole face of the token or plaque for both the thermoplastic material and thermosetting material (as described below), thus allowing a token or a plaque to be obtained with a good surface condition and a high quality visual aspect.

FIGS. 6, 7 and 8 concern a second embodiment of the token or plaque according to the invention and according to which the body of the token or plaque is made of a thermosetting plastic material, in this case a gaming token 30 shown in perspective the flat body 32 of which has two approximately parallel faces 33 and 34.

Generally, the structure of the token 30 is similar to that of the plaque 10' and its description will not be repeated in detail, especially for the same elements.

The token 30 integrates an electronic identifier 36, identical to the electronic identifier 16 described above, placed in a cavity 35 made in the body 32, the antenna of the identifier 36 being placed approximately parallel to faces 33 and 34. Practically, the body 32 is realised from a preform made of thermosetting material including a non-through cavity 35 entering into the body 32 at right angles to faces 33 and 34 visible in FIG. 7. The cavity 35 is obtained either directly when the preform is realised (cold premoulding), or by removing material. As an option, the bottom 40 of the cavity has a central step to determine a housing recess 44 for the electronic identifier 36.

As shown in FIG. 7, the cavity 35 with a central stepped bottom 40 forming a housing 44 includes a face opening 37. The integration of the electronic identifier 16 begins with its placing inside the housing 44 of the cavity 35 approximately at half height followed by the insertion of a plug 39 in the face opening 37 of the cavity 35. The preform of the body of the token is placed in a heating mould 41, 42 of which only the bottom part 42 is shown in FIG. 7.

The plug 39 is inserted in the cavity 35, preferably with a minimum clearance in a solid but deformable state during the later welding stage and offers a sufficient volume to completely fill the cavity 35 and a good weld with the side 43 of the latter when the face opening 37 is closed.

The plug 39 (as well as the body) is made of a thermosetting material, loaded or not; for example a polymer chosen from among the non saturated polyesters loaded between 50% and 70% in weight with barite or barium sulphate.

The integration of the electronic identifier ends with a thermocompression operation with the combined action of heat and pressure in the mould 41, 42, with a temperature of between 120° C. and 160° C. and an applied pressure of between 0.2 and 1 Mpa (between 2 and 10 bars).

As shown in FIG. 8, the plug 39 and 20 under the combined action of heat and pressure applied to each heated area looses its shape and welds with undulated mechanical interlocking 43 to the side wall of the cavity 35 and closes the face openings 37, the limit of the welding area disappearing (at least on the surface) in the event of identical or almost identical thermosetting materials for the plug 39 and the body or the token 32.

Of course, the description of this second embodiment of the invention also applies to rectangular plaques and flat token or plaques with various contours, especially elliptic, as well as to plaques and tokens with through cavities closed by two plugs.

Thus, thanks to the invention described herein, especially in its two preferred embodiments, it is possible to obtain gaming plaques and tokens with electronic identifiers, or similar devices approximately 3 mm thick, of good quality and at a low cost.

The invention is not limited to the use of deformable plugs to close the cavities of the tokens and plaques. Within the scope of the invention, in the variants not described plugs are used that are inserted with a preferably minimum clearance into the face openings of the cavities with a matching shape and directly made one with the body of the token or plaque by glueing or welding (fusion welding or ultrasonic welding) or mechanical interlocking. In one variant of the invention shown in FIGS. 10*a* and 10*b*, the mechanical interlocking is realised after placing the electronic identifier 46 in the cavity 45 by deformation by heating and/or compression of the token body 48 at the level of the surface opening 47 of the cavity 45 and fold down plastic material 53 around the plug 49, preferably previously bevelled (bevel 52).

What is claimed is:

1. A device in the form of, one of, a token or plaque comprising:
    a flat body made of a plastic material, the flat body comprising at least two parallel faces and a cavity which opens to at least one of the at least two parallel faces;
    an electronic identification device arranged in the cavity;
    at least one plug made of a plastic material, the at least one plug being adapted to be inserted into the cavity,
    wherein the electronic identification device is completely enclosed and retained in the flat body when the at least one plug is inserted into the cavity.
2. The device of claim 1, wherein the one of, a token or plaque is one of a gaming token and a gaming plaque.
3. The device of claim 1, wherein the electronic identification device is one of:
    retained on one side by the at least one plug and on another side by the flat body; and
    retained on one side by the at least one plug and on another side by another plug.
4. The device of claim 1, wherein the at least one plug comprises a shape which is substantially similar to a shape of the cavity and wherein the plug is sized to fit within the cavity with a minimum clearance.
5. The device of claim 4, wherein the at least one plug is secured to the flat body by one of glueing, welding, and mechanical interlocking.
6. The device of claim 5, wherein the at least one plug is secured to the flat body by mechanical interlocking, the mechanical interlocking being formed by one of deformation by heating and compression.
7. The device of claim 6, wherein the at least one plug comprises at least one beveled surface.
8. The device of claim 1, wherein the at least one plug is secured to the flat body by welding and wherein the welding utilizes heating and pressure.
9. The device of claim 8, wherein the heating and pressure are applied to the at least one plug and to the at least two parallel faces.
10. The device of claim 1, wherein the cavity comprises a through opening which extends between the at least two parallel faces and wherein the at least one plug comprises at least two plugs.
11. The device of claim 10, wherein the electronic identification device is disposed within the flat body between the at least two plugs.
12. The device of claim 1, wherein the cavity comprises a blind opening which opens to at least one of the at least two parallel faces, the blind opening comprising a flat bottom surface for supporting the electronic identification device.
13. The device of claim 1, wherein the electronic identification device comprises an electronic circuit, memory storage, and an emitter-receiver having a peripheral antenna.
14. The device of claim 13, wherein the flat body comprises one of a rigid plastic shell and a hardened coated resin pellet.
15. The device of claim 14, wherein the flat body comprises a hardened coated epoxy resin pellet.
16. The device of claim 1, wherein the electronic identification device comprises a diameter which is smaller than a diameter of the cavity, the cavity comprising a bottom surface and a lower surface which is stepped below the bottom surface.
17. The device of claim 1, wherein the flat body and the at least one plug comprise one of a polymer material and a material which can be welded.
18. The device of claim 1, wherein the flat body and the at least one plug comprise a thermoplastic material.
19. The device of claim 18, wherein the thermoplastic material comprises one of a styrene, a styrene copolymer, PBS, ABS, a methacrylic, PMMA, a vinyl, PVC, a PVC copolymer, a cellulose, cellulose acetate, a saturated polyester, PBC, a polyolefin, PE hd, and a PE hd copolymer.
20. The device of claim 1, wherein one of the flat body and the at least one plug comprise a thermoplastic material having a vitreous transition temperature of between 40° C. and 130° C.
21. The device of claim 20, wherein the vitreous transition temperature is between 50° C. and 100° C.
22. The device of claim 1, wherein the flat body and the at least one plug comprise a thermosetting plastic material.
23. The device of claim 22, wherein the thermosetting plastic material comprises a non-saturated polyester material.
24. A method of making a device comprising a flat body made of a thermosetting plastic material, the flat body comprising at least two parallel faces and a cavity which opens to at least one of the at least two parallel faces, the cavity being adapted to receive an electronic identification device, at least one plug made of a thermosetting plastic material, the at least one plug being adapted to be inserted into the cavity, wherein the electronic identification is retained in the flat body when the at least one plug is inserted into the cavity, the method comprising:
    making the flat body;
    forming the cavity in the flat body;

placing the electronic identification device in the cavity;

inserting the at least one plug in the cavity; and fixing the at least one plug to the flat body.

25. The method of claim 24, wherein the fixing comprises welding.

26. The method of claim 24, wherein the fixing comprises heating and applying pressure to one of the at least one plug and the flat body.

27. The method of claim 24, further comprising shaping the contour of the flat body by cutting.

28. The method of claim 27, further comprising removing sharp edges from the contour of the flat body by finishing.

29. A method of making a device comprising a flat body made of a plastic material, the flat body comprising at least two parallel faces and a cavity which opens to at least one of the at least two parallel faces, the cavity being adapted to receive an electronic identification device, at least one plug made of a plastic material, the at least one plug being adapted to be inserted into the cavity, wherein the electronic identification is retained in the flat body when the at least one plug is inserted into the cavity, the method comprising:

making a preform body;

forming the cavity in the preform body;

placing the electronic identification device in the cavity;

inserting the at least one plug in the cavity, the at least one plug, the electronic identification device, and the preform body comprising a subassembly;

inserting the subassembly in a thermocompression mold; and fixing the at least one plug to the preform body using the mold so as to retain the electronic identification device within the preform body, wherein the fixing forms the flat body.

30. A device comprising:

a flat body made of a plastic material, the flat body comprising at least two parallel faces and a cavity which opens to at least one of the at least two parallel faces;

an electronic identification device arranged in the cavity;

at least one plug made of a plastic material, the at least one plug being adapted to be inserted into the cavity, wherein the electronic identification device is completely enclosed and retained in the flat body when the electronic identification device is inserted into the cavity and when at least one of:

the at least one plug is deformed after being inserted into the cavity; and the flat body is deformed after the at least one plug is inserted into the cavity.

31. A device comprising:

a flat preform body made of a thermosetting plastic material, the flat preform body comprising at least two parallel faces and a cavity which opens to at least one of the at least two parallel faces;

an electronic identification device arranged in the cavity;

at least one plug made of a thermosetting plastic material, the at least one plug being adapted to be inserted into the cavity, wherein the electronic identification device is retained in the flat body when the electronic identification device is inserted into the cavity.

* * * * *